(12) United States Patent
Lazaro Gallego

(10) Patent No.: US 7,675,009 B2
(45) Date of Patent: Mar. 9, 2010

(54) ELECTRODE FOR MACHINES FOR ELECTROMAGNETIC INDUCTION WELDING OF THE LAYERS FORMING A MULTI-LAYER PRINTED CIRCUIT

(75) Inventor: Victor Lazaro Gallego, Santa Perpetua De Mogoda (ES)

(73) Assignee: Chemplate Materials, S.L., Santa Perpetua De Mogoda (ES)

(*) Notice: Subject to any disclaimer, the term of this patent is extended or adjusted under 35 U.S.C. 154(b) by 304 days.

(21) Appl. No.: 10/557,488

(22) PCT Filed: May 3, 2004

(86) PCT No.: PCT/EP2004/004668

§ 371 (c)(1),
(2), (4) Date: Nov. 21, 2005

(87) PCT Pub. No.: WO2004/105993

PCT Pub. Date: Dec. 9, 2004

(65) Prior Publication Data

US 2007/0045296 A1    Mar. 1, 2007

(30) Foreign Application Priority Data

May 30, 2003    (ES)    ................................ 200301285

(51) Int. Cl.
*H05B 6/10*    (2006.01)
(52) U.S. Cl. ........................ 219/617; 219/659; 219/647

(58) Field of Classification Search ................. 219/617, 219/615, 647, 659, 634, 670, 673, 603, 661, 219/635, 676, 233, 243; 156/380.2, 274.2
See application file for complete search history.

(56) References Cited

U.S. PATENT DOCUMENTS

| 3,467,806 | A | | 9/1969 | Dixon |
| 4,224,494 | A | | 9/1980 | Reboux et al. |
| 4,359,620 | A | | 11/1982 | Keller |
| 5,483,043 | A | | 1/1996 | Sturman et al. |
| 6,271,507 | B2 | * | 8/2001 | Godwin ...................... 219/603 |
| 6,573,477 | B1 | * | 6/2003 | Chang ......................... 219/243 |

FOREIGN PATENT DOCUMENTS

| SU | 1 337 217 | 9/1987 |
| WO | WO 02/34451 | 5/2002 |
| WO | WO 03/056888 | 7/2003 |

* cited by examiner

*Primary Examiner*—Quang T Van
(74) *Attorney, Agent, or Firm*—Sughrue Mion, PLLC

(57) ABSTRACT

A U-shaped magnetic circuit (2) provided with a field winding (3), including respective induction electrodes (5s, 5i) at an outer end of each arm of the magnetic circuit (2) Both electrodes are perpendicularly arranged as regards the multi-layer printed circuit, coaxially to each other and capable of vertical movement in both directions. The end of each induction electrode (5s, 5i) that comes into contact with the multi-layer printed circuit is provided with a thermal barrier, in order to prevent, during the welding, heat transmission by thermal conductivity from the welding zone to the induction electrode (5s, 5i).

5 Claims, 2 Drawing Sheets

ELECTRODE FOR MACHINES FOR ELECTROMAGNETIC INDUCTION WELDING OF THE LAYERS FORMING A MULTI-LAYER PRINTED CIRCUIT

CROSS-REFERENCE TO RELATED APPLICATION

This application is a 371 of PCT/EP2004/004668, filed May 3, 2004; the disclosure of which is incorporated herein by reference.

TECHNICAL FIELD OF THE INVENTION

The object of the invention is an electrode for machines for electromagnetic induction welding of the layers forming a multi-layer printed circuit.

BACKGROUND OF THE INVENTION

The patent document P 200102902, by the same applicant, discloses a procedure for welding the layers forming a multi-layer printed circuit and a machine therefore. Essentially, the machine described in this document comprises one or more induction devices, each of which is made up of a generally U-shaped magnetic circuit wherein an inductor winding is arranged, the ends of the arms of the magnetic circuit being provided with one respective induction electrode and both electrodes being arranged perpendicularly as regards the multi-layer printed circuit to be welded, coaxially to one another, and capable of movement in both directions, the multi-layer printed circuit to be welded being arranged between both induction electrodes.

Induction electrodes are of a material with high magnetic permeability, preferably ferrite, and have a relatively high mass as regards the mass of the welding zone of the multi-layer printed circuit. During the welding of the printed circuit, the induction electrodes of each induction device, which exert pressure on the upper and lower sides respectively of the printed circuit, act as cooling elements of the welding zone they are in contact with; when the welding of the printed circuit is carried out, this causes a thermal imbalance between the layers of the printed circuit in contact with the induction electrodes and the innermost layers thereof, due to the action of the heat evacuation of the welding zone caused by the metallic mass of the induction electrodes, which under certain circumstances, can affect the welding of the printed circuit.

One solution to the problem that cooling of the welding zone creates consists of increasing the welding time, but this causes the innermost layers to overheat, with detrimental effects. Another solution consists of inserting a laminate of thermally insulating material between the end of each induction electrode and the corresponding outer layer of the printed circuit, but this gives rise to the use of additional elements in the welding process and to high preparation times.

EXPLANATION OF THE INVENTION

With the aim of providing a solution to the previously described problems caused by the cooling action which induction electrodes exert in the welding zone of the outermost layers of the multi-layer printed circuit, an induction electrode of new structure and functionality is disclosed herein.

The electrode for machines for electromagnetic induction welding of the layers forming a multi-layer printed circuit object of the invention, is characterised in that the end of each induction electrode that comes into contact with the multi-layer printed circuit is provided with a thermal barrier in order to prevent, during the welding, heat transmission by thermal conductivity from the welding zone to the electrode.

Another characteristic of the invention consists of the thermal barrier being comprised of a body of thermal insulating material coupled to the end of the electrode.

According to another characteristic of the invention, the thermal barrier is comprised of a heating element arranged at the end of the electrode.

According to another characteristic of the invention, the heating element comprises an electrical heating circuit.

Another characteristic of the invention consists of the electrical heating circuit comprising at least one turn in short circuit mode.

According to another characteristic of the invention, the electrical heating circuit comprises at least one electrical resistor which is fed by an energy source external to the electrode.

BRIEF DESCRIPTION OF THE DRAWINGS

In the attached drawings, several embodiments are illustrated of the electrode for machines for electromagnetic induction welding of the layers forming a multi-layer printed circuit. In said drawings.

DETAILED DESCRIPTION OF THE DRAWINGS

Figure 1:
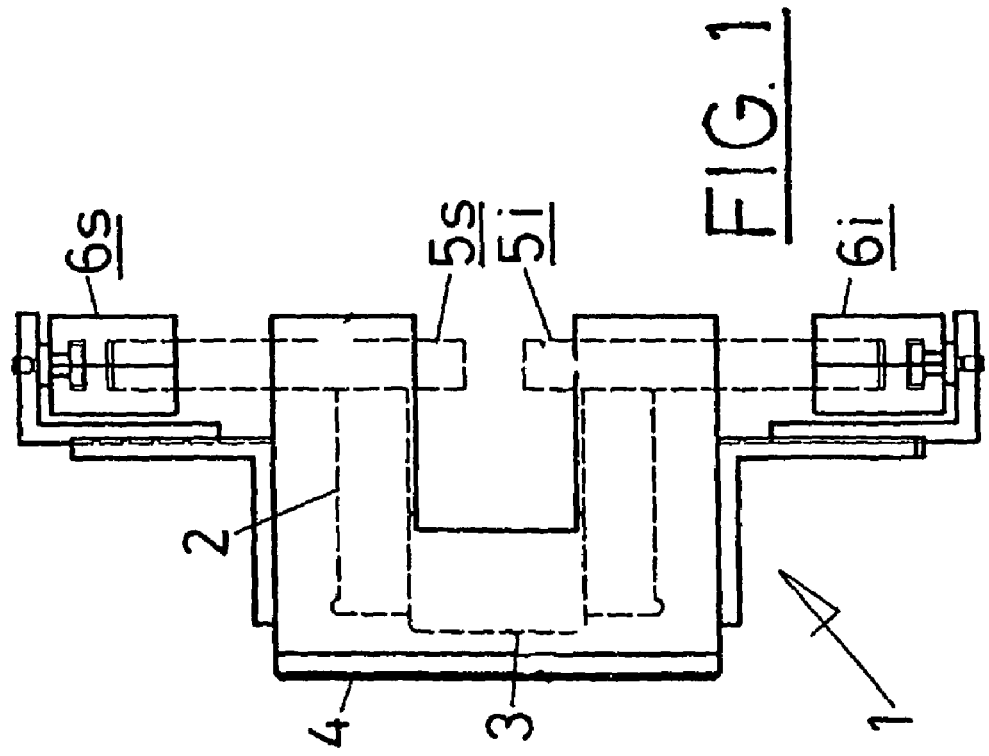
FIG. 1, is a side elevation view of an induction device of a machine for electromagnetic induction welding of the layers forming a printed circuit.

In FIG. 1 an induction device 1 of a machine for electromagnetic induction welding of the layers of a multi-layer printed circuit has been represented. Essentially, the induction device 1 comprises a generally U-shaped magnetic circuit 2, provided with a field winding 3 assembled on a frame 4, the field winding 3 being fed by an alternating current power source which is variable in voltage and frequency, which has not been represented.

The induction device 1 also comprises an upper induction electrode 5s and a lower induction electrode 5i, magnetically connected to corresponding arms of the magnetic circuit 2 and arranged coaxially to each other. The upper induction electrode 5s and the lower one 5i are joined to respective movement means 6s and 6i, so that they are capable of moving vertically in both directions, being arranged between the facing ends and the induction electrodes 5s and 5i the layers of a multi-layer printed circuit, which has not been represented.

Figure 2:
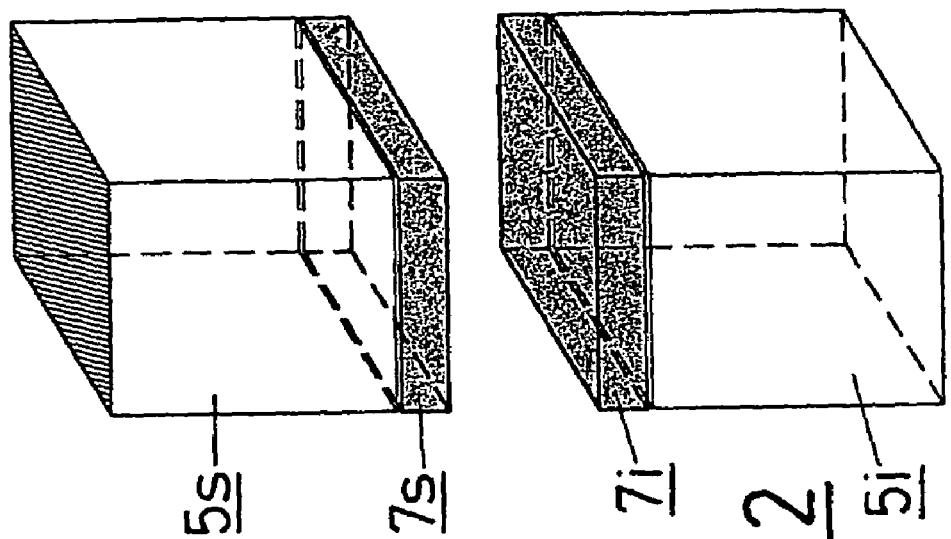
FIGS. 2, 3, 4 and 5, are respective diagrammatic perspective views of different embodiments of the electrode of the invention.

A first embodiment of the electrode of the invention is represented in FIG. 2, wherein the end of each induction electrode that makes contact with the multi-layer printed circuit is provided with a thermal barrier, made up of a body of thermal insulating material represented with the references 7s for the upper induction 5s and 7i for the lower induction electrode 5i.

Figure 3:
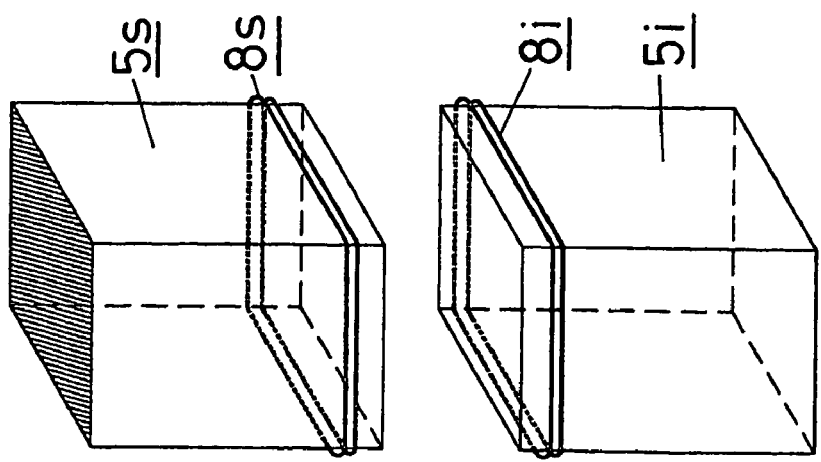

A second embodiment of the electrode of the invention is represented in FIG. 3, wherein the end of each induction electrode that makes contact with multi-layer printed circuit is provided with a thermal barrier made up of two turns in short circuit mode arranged perpendicularly as regards the longitudinal axis of the electrode, completely surrounding it and close to one another, represented as 8s for the upper induction electrode 5s and as 8i for the lower induction electrode 5i. In this embodiment, the end of each induction electrode is provided with two turns in short circuit mode, but it is understood that the thermal barrier can be made up of a single turn in short circuit mode or even by more than two turns in short circuit mode, in accordance with the needs which, as for the thermal barrier, each specific application case presents.

Figure 4:
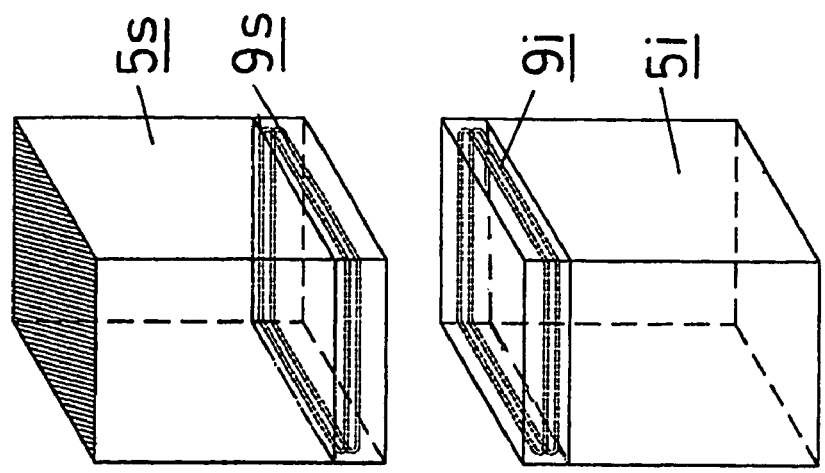

A third embodiment of the electrode of the invention is represented in FIG. 4, wherein it can be seen that the end of each induction electrode that makes contact with the multi-layer printed circuit is provided with two turns in short circuit mode in its interior, arranged perpendicularly as regards the longitudinal axis of the electrode and close to each other, represented as 9s for the upper induction electrode 5s and as 9i for the lower induction electrode 5i. In a similar way to that explained in the second embodiment, the end of each induction electrode is provided inwardly with two turns in short circuit mode, but it is understood that the thermal barrier can be made up of a single turn in short circuit mode, or by more than two turns in short circuit mode.

In view of the second and third embodiments (FIGS. 3 and 4 respectively), it is obvious that the thermal barrier arranged at the end of each induction electrode can be comprised of one or more turns in short circuit mode, arranged so that they are partly included in the electrode and partly surrounding it; that is, an example of such an arrangement, not represented, could consist of arranging two turns in short circuit mode, coplanar to each other and perpendicular as regards the longitudinal axis of the induction electrode, so that each of the turns in short circuit mode clasps a different portion of the transverse section of the electrode. It follows that numerous embodiments of the induction electrode are possible wherein the turns in short circuit mode partly clasp the transverse section thereof.

Figure 5:
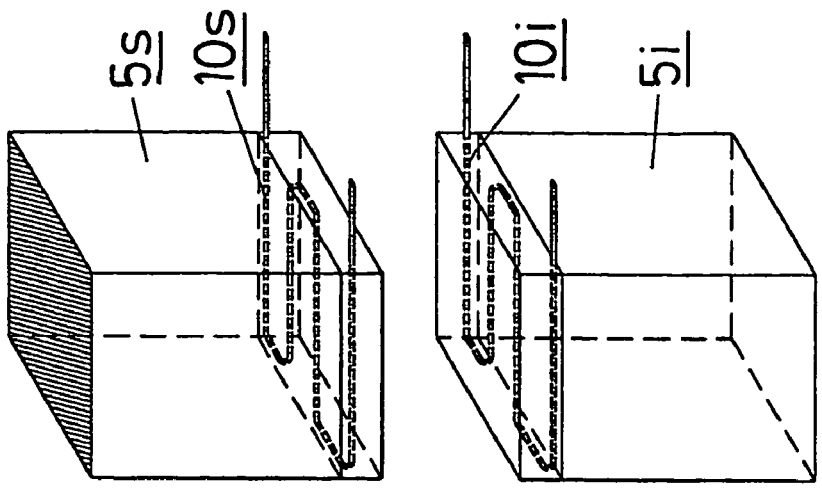

In FIG. 5 a fourth embodiment of the electrode of the invention has been represented, it being seen that the end of each induction electrode that comes into contact with the multi-layer printed circuit is provided with an electrical resistor in its interior, represented as 10s for the upper induction electrode 5s and as 10i for the lower induction electrode 5i. Each electrical resistor 10s and 10i is provided with respective conductors to allow for its electrical connection to a power supply whose voltage may be regulated, in order that the intensity which circulates through the resistors may be regulated and thus regulate the temperature reached at the end of the induction electrodes 5s and 5i.

The invention claimed is:

1. An induction device (1) of a machine for electromagnetic induction welding of the layers of a multi-layer printed circuit, the induction device (1) comprising:
a magnetic circuit (2) fitted with a field winding provided with an upper induction electrode (5s) and a lower induction electrode (5i) magnetically connected to corresponding arms of the magnetic circuit (2) and arranged coaxially to each other, the upper induction electrode (5s) and the lower one (5i) being capable of moving vertically in both directions,
wherein the end of each induction electrode (5s, 5i) destined to come into contact with the multi-layer printed circuit is provided with a thermal barrier, made up of a heating element comprising an electrical heating circuit (8s-8i, 9s-9i, 10s-10i) which heats the electrodes in order to prevent, during the welding, heat transmission by thermal conductivity from the welding zone to the electrode, and
wherein the electrical heating circuit is distinct from the magnetic circuit and the field winding, and
wherein the electrical heating circuit directly heats the electrodes.

2. Electrode for machines for electromagnetic induction welding of the layers forming a multi-layer printed circuit, applicable to machines fitted with at least one induction device (1) provided with a U-shaped magnetic circuit (2) fitted with a field winding (3), comprising at the outer end of each arm of the magnetic circuit (2) one respective induction electrode (5s, 5i), both electrodes being perpendicularly arranged as regards the multi-layer printed circuit, coaxially to each other and capable of vertical movement in both directions,
wherein the end of each induction electrode (5s, 5i) destined to come into contact with the multi-layer printed circuit is provided with a thermal barrier, in order to prevent, during the welding, heat transmission by thermal conductivity from the welding zone to the electrode, wherein the thermal barrier is made up of a heating element (8s-8i, 9s-9i, 10s-10i) arranged at the end of the electrode (5s, 5i) which heats the electrodes, and wherein the heating element comprises an electrical heating circuit (8s-8i, 9s-9i, 10s-10i), and
wherein the electrical heating circuit is distinct from the magnetic circuit and the field winding, and
wherein the electrical heating circuit directly heats the electrodes.

3. Electrode according to claim 2, wherein the thermal barrier is made up of a body of thermal insulating material (7s, 7i) coupled to the end of the electrode (5s, 5i).

4. Electrode according to claim 2, wherein the electrical heating circuit comprises at least one turn in short circuit mode (8s-8i, 9s-9i).

5. Electrode according to claim 2, wherein the electrical heating circuit comprises at least one electrical resistor (10s-10i) which is fed by an energy source external to the electrode.

* * * * *